United States Patent
Hsieh et al.

(10) Patent No.: US 7,088,030 B2
(45) Date of Patent: Aug. 8, 2006

(54) HIGH-ASPECT-RATIO-MICROSTRUCTURE (HARM)

(75) Inventors: Jerwei Hsieh, Sanchong (TW); Huai-Yuan Chu, Shulin (TW); Julius Ming-Lin Tsai, Taipei (TW); Weileun Fang, Hsinchu (TW)

(73) Assignee: Walsin Lihwa Corporation, Taipei (TW)

( * ) Notice: Subject to any disclaimer, the term of this patent is extended or adjusted under 35 U.S.C. 154(b) by 81 days.

(21) Appl. No.: 10/839,844

(22) Filed: May 6, 2004

(65) Prior Publication Data

US 2004/0232502 A1 Nov. 25, 2004

(30) Foreign Application Priority Data

May 6, 2003 (TW) .............................. 92112374 A

(51) Int. Cl.
*H02N 1/00* (2006.01)
*G02B 26/08* (2006.01)

(52) U.S. Cl. ........................................ 310/309; 438/52

(58) Field of Classification Search ................ 310/309; 359/223–226, 290–291; 73/514.32; 385/18; 438/52
See application file for complete search history.

(56) References Cited

U.S. PATENT DOCUMENTS 5,316,979 A * 5/1994 MacDonald et al. .......... 438/52
6,149,190 A * 11/2000 Galvin et al. ................ 280/735
6,151,966 A * 11/2000 Sakai et al. ............... 73/514.32
6,276,207 B1 * 8/2001 Sakai et al. ............... 73/514.16
6,450,031 B1 * 9/2002 Sakai et al. ............... 73/514.16
6,497,141 B1 * 12/2002 Turner et al. .................. 73/105
6,689,694 B1 * 2/2004 Cho et al. .................... 438/696
6,925,710 B1 * 8/2005 Scalf et al. .................... 29/847
2001/0044165 A1 * 11/2001 Lee et al. ...................... 438/52
2003/0048036 A1 * 3/2003 Lemkin ...................... 310/309
2004/0097001 A1 * 5/2004 Hsieh et al. ................... 438/50
2004/0232110 A1 * 11/2004 Hsieh et al. ................... 216/58
2004/0232502 A1 * 11/2004 Hsieh et al. .................. 257/415

FOREIGN PATENT DOCUMENTS

JP 09-055337 * 2/1997

* cited by examiner

*Primary Examiner*—Karl Tamai
(74) *Attorney, Agent, or Firm*—Volpe and Koenig, PC

(57) ABSTRACT

A high-aspect-ratio-microstructure (HARM) is provided. The structure includes: a substrate; a lower structure with a comb shape fixedly mounted on said substrate and having first plural comb fingers, wherein each of the first plural comb fingers has a thin slot thereon; an upper structure with a comb shape having second plural comb fingers, wherein the lower structure and the upper structure have a height difference therebetween so as to form an uneven surface; and a lateral strengthening structure formed at vertically peripheral walls of the first plural comb fingers and the second plural comb fingers for protecting the plural first and second comb fingers.

19 Claims, 13 Drawing Sheets

HIGH-ASPECT-RATIO-MICROSTRUCTURE (HARM)

FIELD OF THE INVENTION

The present invention is related to a structure applied in the Micro-Electro-Mechanical System (MEMS), and more particularly, to a high-aspect-ratio-microstructure (HARM) which is applied to an actuator.

BACKGROUND OF THE INVENTION

Nowadays, the Micro-Electro-Mechanical System (MEMS) is a newly developed field that every country in the world is actively interfering and participating in. MEMS is a miniature system which generates a predict movement. With the advance of the modern technology, the system size and volume have been smaller and more delicate. The system miniaturization has led to many advantages. (1) Mass production: Several hundreds to several thousands of mechanical components can be formed on a single one silicon chip at the same time. Similar to the IC manufacture, the manufacture cost can be reduced accordingly. (2) Miniaturization: A quite small but still having high accuracy mechanical component can be produced by applying the method for optical image. (3) Preciseness: The manufacturing process of the micro-mechanical technology is quite accurate. (4) Integration: When manufacturing the mechanical elements, the electronic elements can be made at the same time. In other words, the mechanical elements and the electronic elements can be integrated on the same silicon chip. Particularly, the Micro-Electro-Mechanical System mainly utilizes the systematic technology, the micro-technology, and the material and effect technology for manufacturing the micro-detector, signal processor, micro-actuator, and etc. The future application fields are very wide, including manufacture, automation, information and communication, aerospace industry, transportation, civil construction, environmental protection, agriculture and fishery, and medical science.

In the past, the conventional micro-detector or micro-actuator only has in-plane motion, that is, a single-direction movement or a movement parallel to the chip surface. Recently, the micro-actuator having the feature of being movable in 2-dimensioal direction has been largely studied. Therefore, the out-of-plane motion, the movement direction unparallel to the chip surface, has been applied to the industry gradually. The out-of-plane motion including side movement and lateral movement, in fact, plays an important and key role in the optical application, such as the optical switch or the photo scanning. With the respect of the actuation driven by static electricity, the out-of-plane motion can be achieved by the in-plane actuator, horizontal comb actuator and vertical comb actuator. As shown in FIG. 1, FIG. 1(a) is an in-plane actuator, FIG. 1(b) is a horizontal comb actuator and FIG. 1(c) is a vertical comb actuator. Among these actuators, only the vertical comb actuator provides a wider movement and a direct moving mechanism. Please refer to FIG. 1(c). A vertical comb actuator is usually a relative comb structure, which includes an upper electrode 82 as the movable electrode and a lower electrode 80 as the fixed electrode. Since the upper electrode 82 and the lower electrode 80 are designed to have a height difference therebetween, a vertical actuating force is generated by the electric field having unsymmetrical directions.

Presently, the body structure made of the single crystal silicon (SCS) is very common in MEMS. Although the single crystal silicon is a brittle material, the flexibility of the structure is significantly increased owing to the particular feature of the MEMS structure that the volume is extremely small. Other than that, the mechanical strength of the MEMS structure is higher than that of most metals and alloys. The MEMS structure not only has no problem of the thin film stress, but also has a smaller signal shift induced by temperature due the fact that it has a thermal expansion coefficient smaller than that of a metal. Besides, the method using the SCS material for manufacturing the high-aspect-ratio-microstructure (HARM) has been transformed from the traditional bulk micromachining which has the shape limitation into an advanced method that is able to manufacture various thick structures. In addition, the manufactured thick structure owns many advantages including a higher driving frequency, a smaller dynamic distortion of the structure, a smaller effect from the out-of-plane perturbation motion, and a larger range of the structural rigidity.

However, the manufacturing method for a high-aspect-ratio-microstructure (HARM) having a height difference is still heavy and complicated. Please refer to FIGS. 2(a)–(n) which show the steps of the conventional manufacturing method for a high-aspect-ratio-microstructure (HARM). FIGS. 2(a)–(f) show the manufacturing steps for the upper electrode of the HARM. FIGS. 2(g)–(m) show the manufacturing steps for the lower electrode of the HARM. First, a silicon substrate 11 is provided. An etching process is performed from the back by using the photoresist 12 as a mask, as shown in FIG. 2(a). After the photoresist 12 is removed, the aurum/chromium layer 13 is coated on the silicon substrate 11, as shown in FIG. 2(b). Then, by using the photoresist 14 as a mask, the aurum/stannum layer 15 is grown on a part of the aurum/chromium layer 13 by electroplating, as shown in FIG. 2(c). Then, the photoresist 16 is covered on the aurum/stannum layer 15 as a mask, and the photoresist 14 and partial aurum/chromium layer 13 are removed, as shown in FIG. 2(d). Next, the comb-shaped patterning mask 17 is formed on the silicon substrate 11, as shown in FIG. 2(e). The inductively coupled plasma-reactive ion etching (ICP-RIE) is performed so as to define the thickness of the comb-shaped upper electrode, as shown in FIG. 2(f). Therefore, the comb-shaped upper electrode 18 is accomplished so far. The lower electrode is then manufactured as follows. First, the silicon substrate 21 is provided. An etching process is performed from the back by using the photoresist 22 as a mask, as shown in FIG. 2(g). Then, the silicon substrate 21 is fixed on the glass substrate 23 through anode bonding, as shown in FIG. 2(h). The lateral sides of the silicon substrate 21 are etched by using the photoresist 24 as a mask, as shown in FIG. 2(i). After the photoresist 24 is removed, the aurum/chromium layer 25 is coated on the silicon substrate 21, as shown in FIG. 2(j). Next, the photoresist 26 is covered on the aurum/chromium layer 25 formerly coated on the lateral sides of the silicon substrate 21. A part of the aurum/chromium layer 25 and the partial silicon substrate 21 are then removed, as shown in FIG. 2(k). Next, the comb-shaped patterning mask 27 is formed on the silicon substrate 21, as shown in FIG. 2(l). The inductively coupled plasma-reactive ion etching (ICP-RIE) is performed so as to define the thickness of the comb-shaped lower electrode, as shown in FIG. 2(m). Therefore, the comb-shaped lower electrode 28 is accomplished accordingly. Lastly, the accomplished upper electrode 18 is reversed and aligned with the lower electrode 28 for forming a chip by fixedly connecting the upper electrode 18 and the lower electrode 28, as shown in FIG. 2(n). Accordingly, a high-aspect-ratio-microstructure (HARM) having a height difference is accomplished.

From the above description, it is known that the manufacturing method for the HARM having a height difference is still very complex. When a manufacturing process has too many steps, the quality and the stability of each step are hard to control, which might result in an unstable manufacturing process. On the other hand, since the upper electrode 18 and the lower electrode 28 are manufactured separately, an accurate connecting process is absolutely required in order to solve the alignment problem therebetween. Since the accuracy of the internal distance between the upper electrode 18 and the lower electrode 28 will seriously affect the actuation stability, the requirement for the alignment accuracy is very high. If the alignment between the upper electrode 18 and the lower electrode 28 is not accurate enough, both the electrodes can not move smoothly in the electric field for generating a stable actuation force. Therefore, the allowable alignment error is quite small.

Besides, in order to help the alignment process during the connecting step, enough interval distance between the two electrodes must be remained. That is, the interval distance is limited within a certain range when manufacturing the upper electrode and the lower electrode. In fact, a lengthier interval distance would reduce the generated actuation force, and consequently the actuator effect would be affected.

In addition, the above manufacturing process for the silicon chip often has the unavoidable problem of not having enough conductive depth for the structure. Since the doped depth of silicon is mostly limited within 10 micrometer, the deeper part of the thick structure is usually not conductive, which affects the actuation and the detection feature. Presently, the conductivity is achieved by additionally attaching a conductive/dielectric layer to the structure. However, this solution still generates other problems in the latter manufacturing process, such as the difficulty for chip connection, the hardship to attach a metal lateral wall on the structure, and the machining limitation. The advantages from a pure silicon structure would disappear as well.

On the other hand, since the generated actuation force is affected by the motion of the upper electrode, the design for the elastic spring (deformation) which is served as the distortion axis is very critical. If the structure of the elastic spring (deformation) is too thick, the allowable range of the rotational angle will be decreased. However, the accomplished structure obtained from the above manufacturing process can only have one identical thickness. The thickness of the body structure can not be maintained if the thickness of the distortion axis is trimmed or decreased. Therefore, the conventional manufacturing process has a certain limitation for the thickness of the elastic spring (deformation).

From the above description, it is known that how to simplify the complex manufacturing process for the high-aspect-ratio-microstructure (HARM) and solve the alignment problem between the upper and lower electrodes in order to develop a HARM manufacturing process with higher stability, fewer design limitation and better manufacturing ability have become a major problem waited to be solved in the industry. In order to overcome the drawbacks in the prior art, a selective etching method with lateral protection function, which is applied to the manufacture of the 3-D components, is provided in the present invention.

SUMMARY OF THE INVENTION

The main purpose of the present invention is to provide a selective etching method with lateral protection function for manufacturing a high-aspect-ratio-microstructure (HARM). The upper structure and the lower structure are formed simultaneously. Therefore, the process for connecting the upper structure and the lower structure is eliminated and the problems of chip alignment and chip connection do not exist.

It is one object of the present invention to provide a selective etching method with lateral protection function, which employs a boron ion diffusion process. The boron-doped silicon with the feature of stopping the etching is applied to the structure so as to form a lateral strengthening structure. Since the lateral strengthening structure provides protection for the peripheral wall, the selective etching can be achieved that partial structure is released through silicon wet-etching. On the other hand, the lateral strengthening structure formed through the boron diffusion mechanism not only has the feature of being insulating to the silicon substrate, but also provides the electricity-conductive function.

It is another object of the present invention to provide a selective etching method for manufacturing a high-aspect-ratio-microstructure (HARM) that not only the upper structure and the lower structure are formed simultaneously, but also only three photo masks are needed in the manufacturing process. The upper structure and the lower structure of the generated HARM have a height difference therebetween, which renders the upper surface of the generated HARM an uneven surface. Hence, the manufacturing process for the HARM is significantly simplified.

It is another object of the present invention to provide a manufacturing process for a high-aspect-ratio-microstructure (HARM) that the interval distance between the upper and lower structures of the generated HARM is maintained short. Further, the thickness of any portion of the generated HARM can be adjusted in the manufacturing process according to different needs.

According to one aspect of the present invention, a selective etching method, includes steps of: (a) providing a substrate; (b) forming a first mask layer having plural openings on the substrate; (c) forming a second mask layer on the first mask layer and forming the second mask layer in at least one of the openings for covering at least one part of the substrate; (d) forming a photoresist layer on the second mask layer and the part of the substrate so as to form plural etching windows directly on the substrate; (e) etching downwards the substrate through the plural etching windows by a first etching process so as to extend the plural etching windows downwards into the substrate; (f) removing the photoresist layer and etching the substrate through the plural openings by a second etching process so as to form plural tunnels with different depths; (g) forming a lateral strengthening structure at a peripheral wall of the plural tunnels with different depths; (h) removing the second mask layer, a bottom portion of the lateral strengthening structure, and a part of the substrate by a third etching process so as to form a lower structure and expose an unstrengthened structure; (i) etching the unstrengthened structure laterally so as to form an upper structure.

In accordance with the present invention, the substrate is a silicon substrate.

Preferably, the first mask layer is made of a $Si_3O_4$ material.

Preferably, the second mask layer is made of a SiO$_2$ material.

Preferably, the steps (b)–(d) are accomplished by a photolithography process with a yellow light.

Preferably, the steps (e), (f), and (h) are accomplished by an inductively coupled plasma-reactive ion etching (ICP-RIE) process.

Preferably, the lateral strengthening structure has a wet-etching resisting material and is formed by a boron ion diffusion process.

Preferably, the wet-etching resisting material is a boron-doped silicon.

Preferably, the lateral strengthening structure has a wet-etching resisting material and is formed by a silicon oxidization process.

Preferably, the wet-etching resisting material is a silicon dioxide (SiO$_2$).

Preferably, the lower structure is a fixed lower electrode with a comb shape.

Preferably, the step (i) is accomplished by a silicon wet-etching process.

Preferably, the upper structure is a movable upper electrode with a comb shape.

Preferably, a high-aspect-ratio-microstructure (HARM) is manufactured by the selective etching method.

Preferably, the step (e) further defines a post structure and an elastic structure.

Preferably, the step (f) further defines respective depths of the upper structure, said post structure and said elastic structure.

Preferably, the step (h) selectively respective thins thicknesses of said lower structure and said elastic structure so as to create a height difference of an upper surface of the high-aspect-ratio-microstructure (HARM).

Preferably, the step (i) further forms the elastic structure.

According to another aspect of the present invention, a selective etching method includes steps of: (a) providing a substrate; (b) forming a plurality of tunnels; (c) forming a lateral strengthening structure at a peripheral wall of the tunnels; (d) removing a bottom portion of the lateral strengthening structure, and a part of the substrate by an etching process so as to form a lower structure and expose an unstrengthened structure; and (f) etching the unstrengthened structure laterally so as to form an upper structure.

According to another aspect of the present invention, a high-aspect-ratio-microstructure (HARM) includes: a substrate; a lower structure with a comb shape fixedly mounted on said substrate and having first plural comb fingers, wherein each of the first plural comb fingers has a thin slot thereon; an upper structure with a comb shape having second plural comb fingers, wherein the lower structure and the upper structure have a height difference therebetween so as to form an uneven surface; and a lateral strengthening structure formed at vertically peripheral walls of the first plural comb fingers and the second plural comb fingers for protecting the plural first and second comb fingers.

In accordance with the present invention, the first plural comb fingers and the second plural comb fingers are respectively extended into spaces therebetween.

Preferably, the high-aspect-ratio-microstructure further includes a post structure formed on the substrate and extended upwards thereon.

Preferably, the post structure is a boron post.

Preferably, the post structure includes the lateral strengthening structure for protecting the post structure.

Preferably, a first space positioned under the post structure is formed by etching the substrate.

Preferably, the post structure is vertically connected to an elastic structure.

Preferably, the post structure and the elastic structure constitute an elastic bridge.

Preferably, the elastic bridge is connected to the upper structure for providing an elastic force to render the upper structure movable in a vertical and a horizontal directions.

Preferably, the substrate is a silicon substrate.

Preferably, the lower structure is a fixed lower electrode with a comb shape.

Preferably, a second space positioned under the thin slot is formed by etching the substrate.

Preferably, the upper structure is a movable upper electrode with a comb shape.

Preferably, the lateral strengthening structure has a wet-etching resisting material and is formed by a boron ion diffusion process.

Preferably, the wet-etching resisting material is a boron-doped silicon.

Preferably, the lateral strengthening structure made of a boron-doped silicon is a conductive layer.

Preferably, the lateral strengthening structure has a wet-etching resisting material and is formed by a silicon oxidization process.

Preferably, the wet-etching resisting material is a silicon dioxide (SiO$_2$).

According to another aspect of the present invention, a high-aspect-ratio-microstructure (HARM) includes a substrate; a post structure formed on the substrate and extended upwards; an elastic structure vertically connected to the post structure; a lower structure with a comb shape fixedly mounted on the substrate and having first plural comb fingers, wherein each of the first plural comb fingers has a thin slot thereon; an upper structure with a comb shape connected with the elastic structure for being movable by an elastic force thereof and having second plural comb fingers, wherein the plural first comb fingers and the plural second comb fingers are respectively extended into spaces therebetween, and wherein a height difference is formed between the lower structure and the upper structure so as to form an uneven surface; and a lateral strengthening structure formed at periphery-vertical walls of the first plural comb fingers and the second plural comb fingers for protecting the first and second plural comb fingers.

The foregoing and other features and advantages of the present invention will be more clearly understood through the following descriptions with reference to the drawings, wherein:

DETAILED DESCRIPTION OF THE PREFERRED EMBODIMENT

Figure 1A:
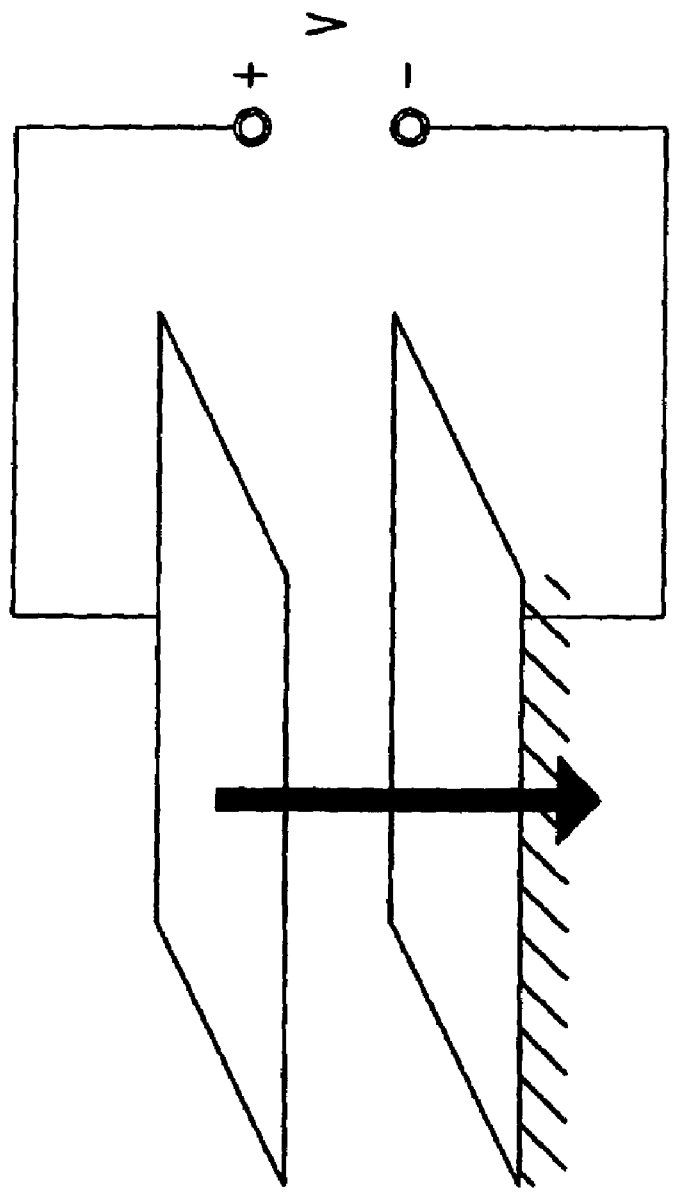
FIGS. 1(a)–(c) are diagrams showing different forms of actuators according to the prior art.
Figure 1B:
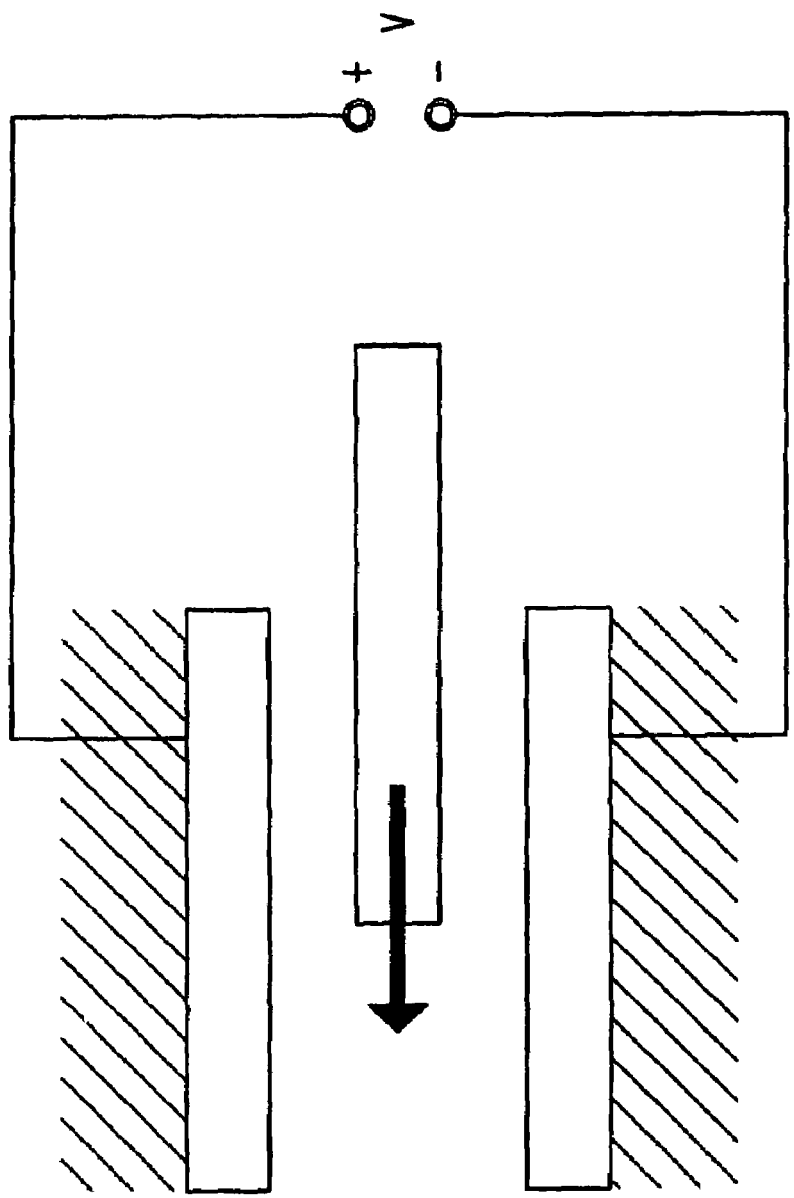
Figure 1C:
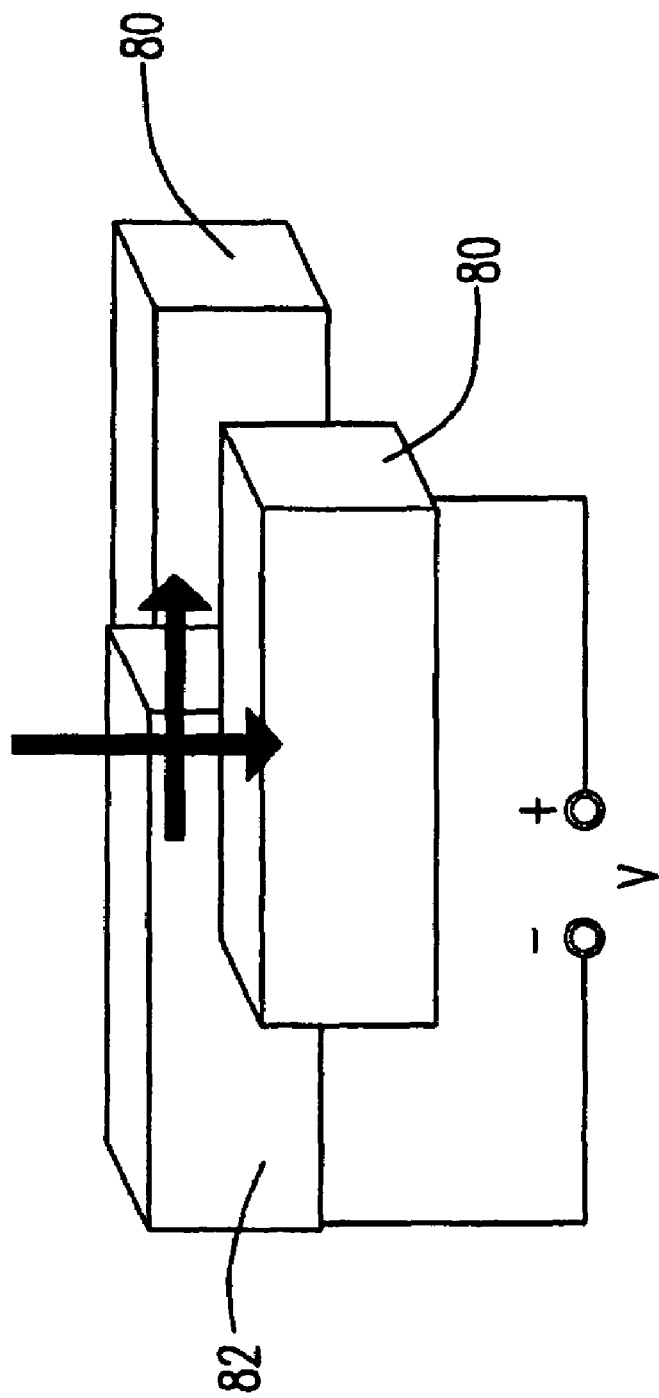
Figure 2A:
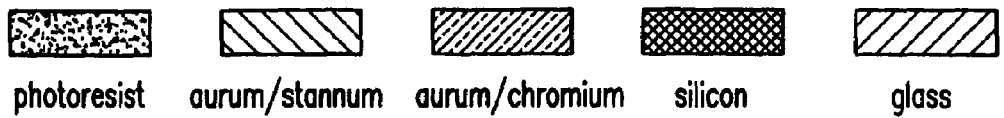
FIGS. 2(a)–(n) are diagrams illustrating the steps of the conventional manufacturing method for a high-aspect-ratio-microstructure (HARM) according to the prior art.
Figure 2A:
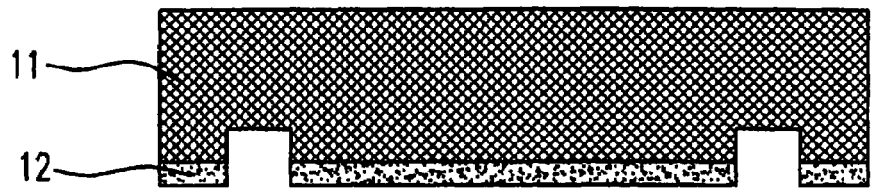
Figure 2B:
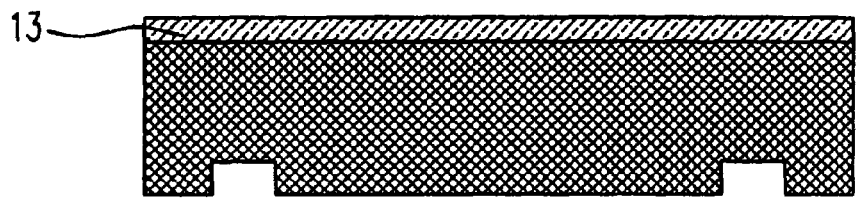
Figure 2C:
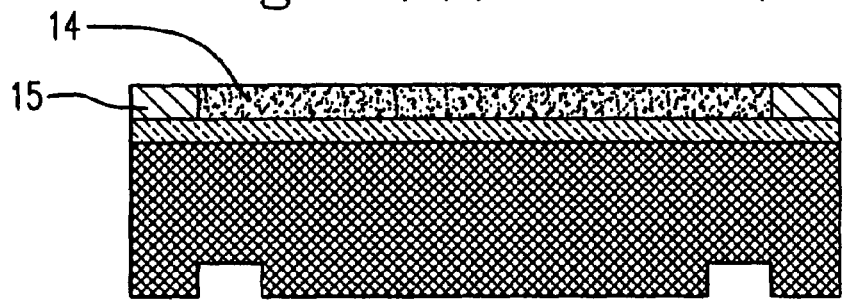
Figure 2D:
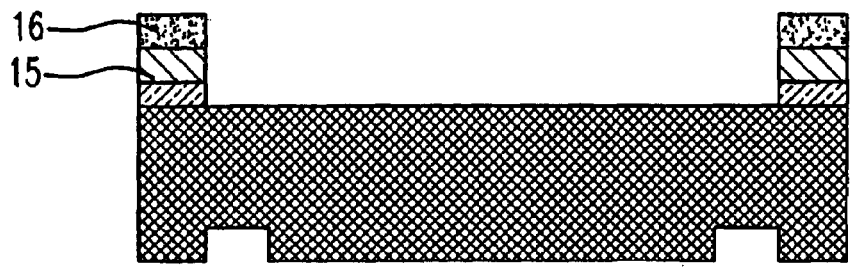
Figure 2E:
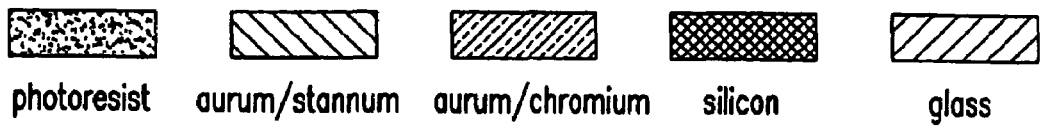
Figure 2E:
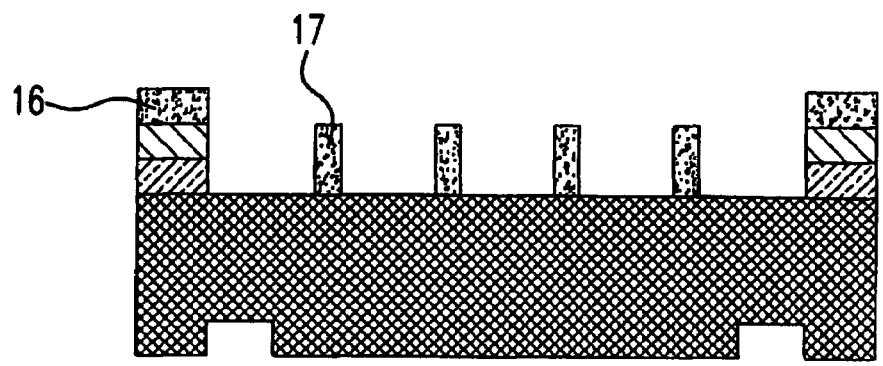
Figure 2F:
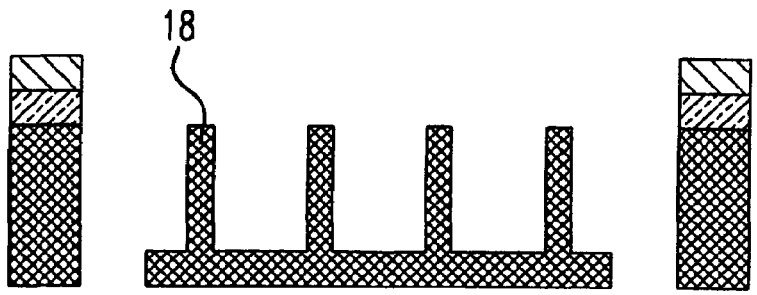
Figure 2G:
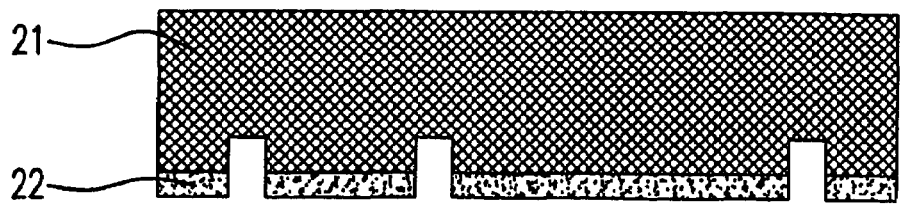
Figure 2H:
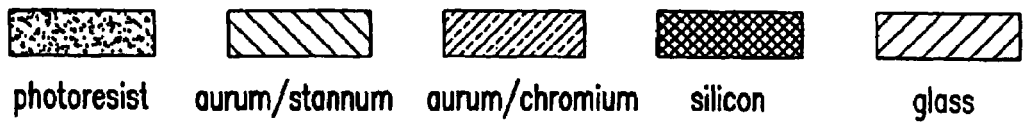
Figure 2H:
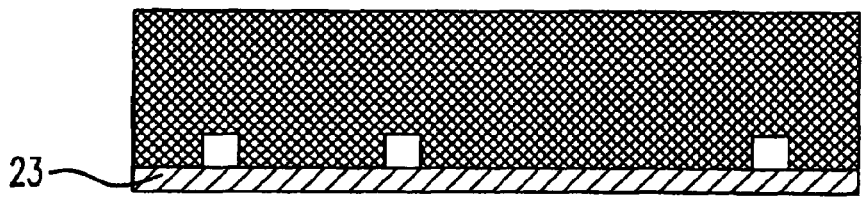
Figure 2I:
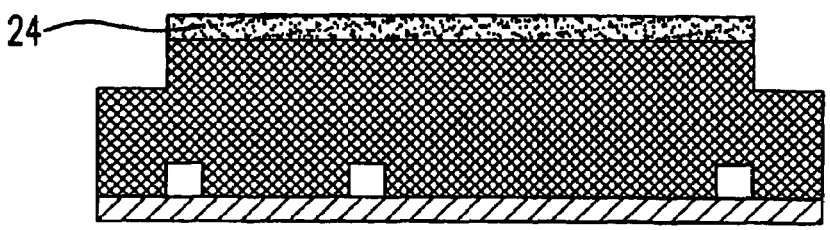
Figure 2J:
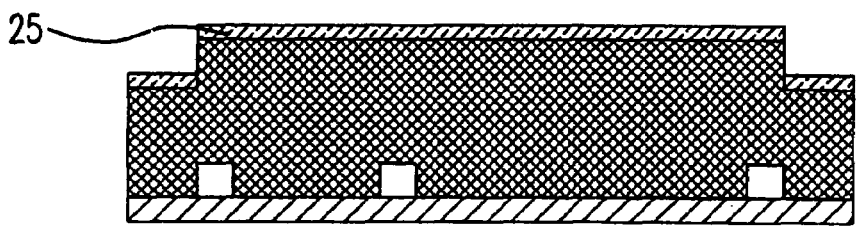
Figure 2K:
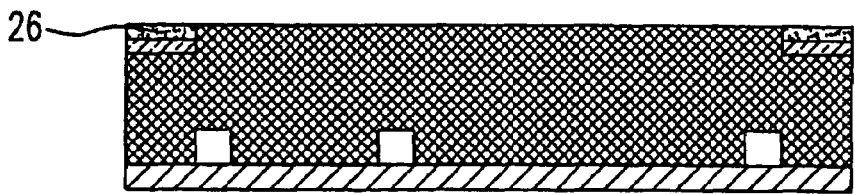
Figure 2L:
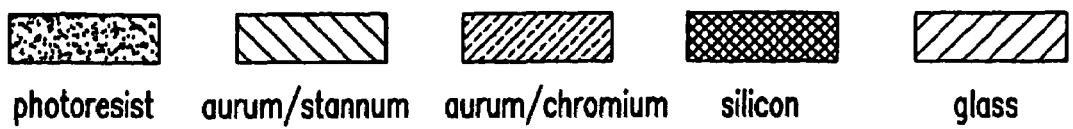
Figure 2L:
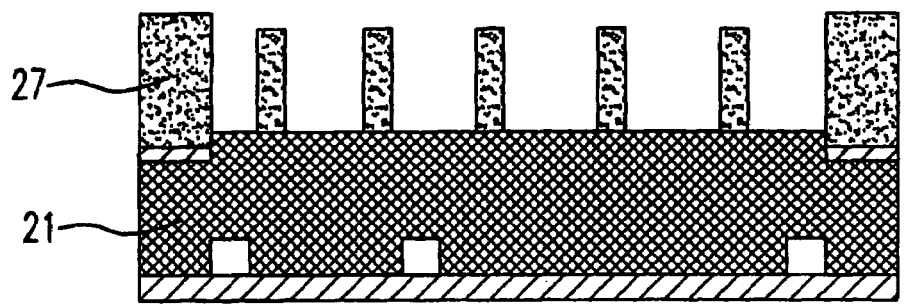
Figure 2M:
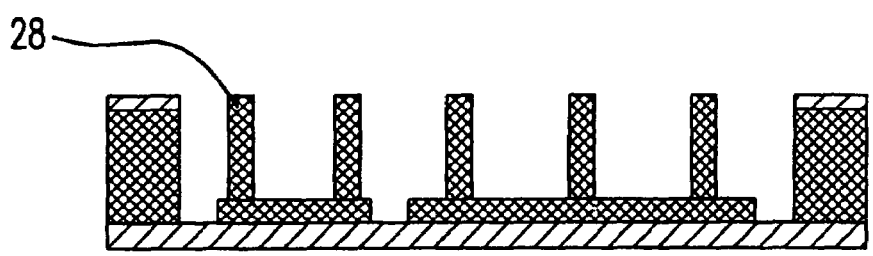
Figure 2N:
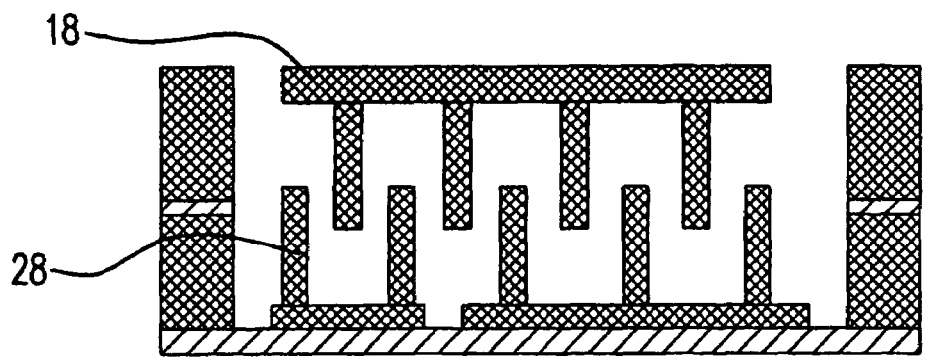
Figure 3A:
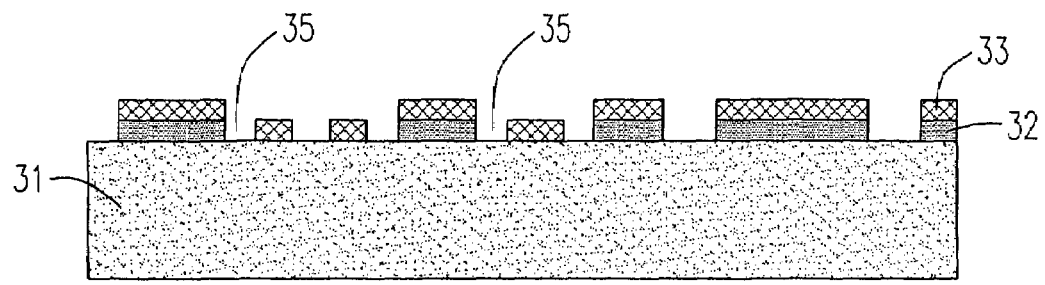
FIGS. 3(a)–(f) are sectional views taken along line III—III in FIG. 4 illustrating the steps of the manufacturing method for a high-aspect-ratio-microstructure (HARM) according to a preferred embodiment of the present invention.
Figure 3B:
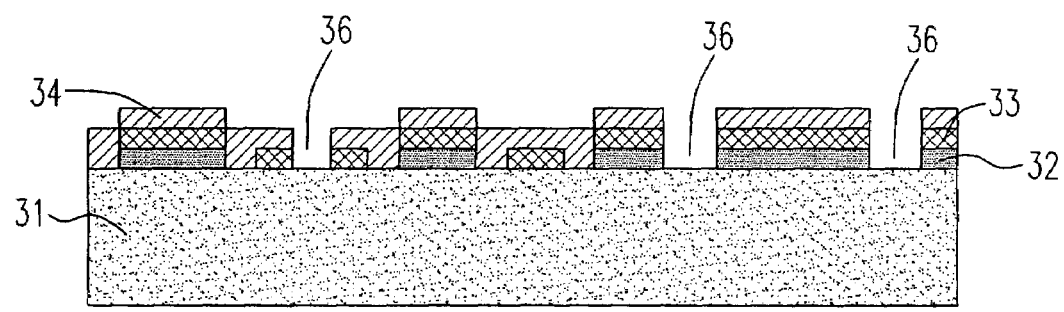
Figure 3C:
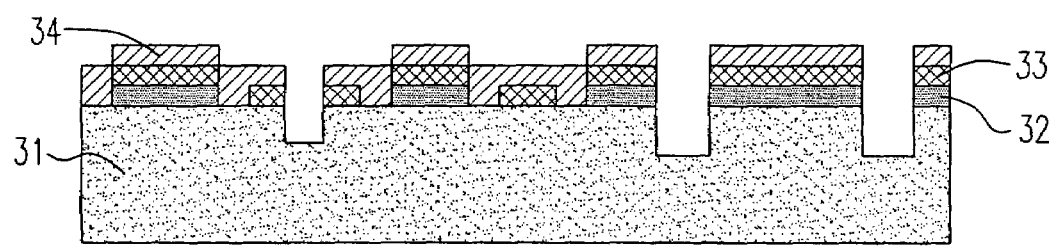
Figure 3D:
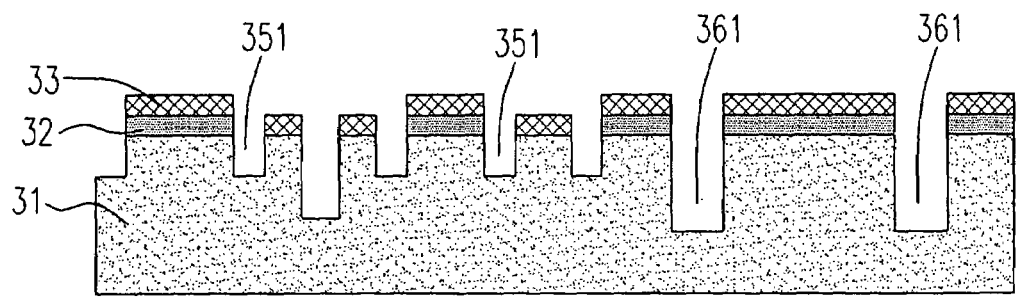
Figure 3E:
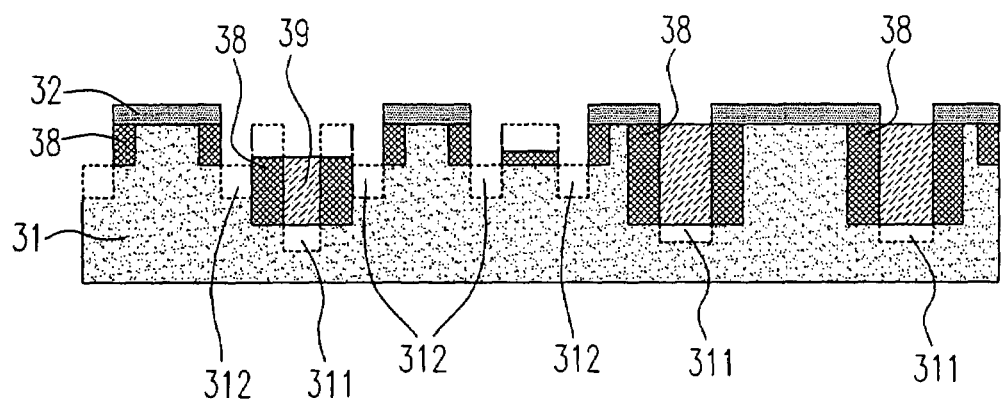
Figure 3F:
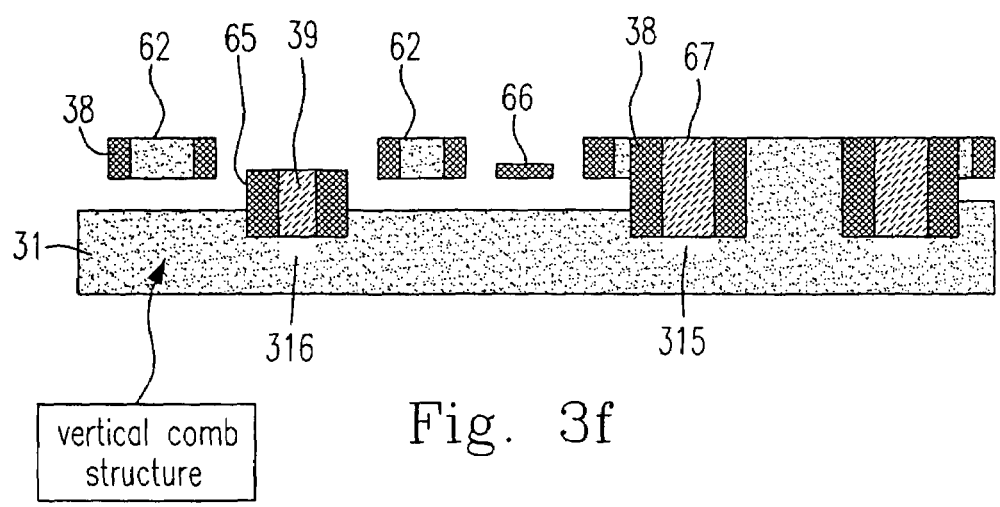

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Please refer to FIGS. 3(*a*)–(*f*). FIGS. 3(*a*)–(*f*) are diagrams illustrating the steps of the manufacturing method for a high-aspect-ratio-microstructure (HARM) according to a preferred embodiment of the present invention. FIGS. 3(*a*)–(*f*) show the sectional view of the HARM. Firstly, a silicon substrate 31 is provided. The first mask layer 32 having plural openings 35 is formed on the silicon substrate 31. The second mask layer 33 is formed on the first mask layer 32. As shown in FIG. 3(*a*), the second mask layer 33 is then formed in at least one of openings 35 for covering at least one part of the silicon substrate 31. Next, as shown in FIG. 3(*b*), a photoresist layer 34 is formed on the second mask layer 33 and part of the silicon substrate 31 so as to form plural etching windows 36 directly on the silicon substrate 31. It is noted here that the etching window 36 is not covered by the photoresist layer 34. Further, the first mask layer 32, the second mask layer 33, and the photoresist layer 34 are formed by the photolithography process with yellow light. The first mask layer 32 is made of $Si_3O_4$ material, while the second mask layer 33 is made of $SiO_2$ material.

As shown in FIG. 3(*c*), the first etching process is preformed by an inductively coupled plasma-reactive ion etching (ICP-RIE) process for etching downwards the silicon substrate 31 through the plural etching windows 36 so as to extend the plural etching windows 36 downwards into the silicon substrate 31. Accordingly, the etching window 36 will have a certain depth. And, the body structure of HARM is therefore patterned that the positions of the upper structure, the lower structure, the post structure, and the elastic structure are basically defined. Then, as shown in FIG. 3(*d*), the second etching process is preformed by an inductively coupled plasma-reactive ion etching (ICP-RIE) process for removing the photoresist layer 34 and etching the silicon substrate 31 through the plural openings 35. Accordingly, the plural tunnels 351 and 361 with different depths are formed. In the second etching process, the defined depth of the tunnels 351 is the depth of the upper structure and the elastic structure formed afterwards. The defined depth of the tunnels 361 is the depth of the post structure formed afterwards.

Next, a boron ion diffusion process is performed for forming a lateral strengthening structure 38 at a peripheral wall of the plural tunnels 351 and 361 with different depths. As such, the composition of the peripheral wall of the plural tunnels 351 and 361 becomes a wet-etching resisting material, that is, boron-doped silicon. Consequently, the lateral strengthening structure 38 is formed at the peripheral wall of the plural tunnels 351 and 361, as shown in FIG. 3(*e*). According to another aspect of the present invention, the diffusion process is not limited to the implement of boron ion. The lateral strengthening structure 38 can be formed by a silicon oxidization process as well and the generated wet-etching resisting material is silicon dioxide ($SiO_2$).

Then, the third etching process is preformed by an inductively coupled plasma-reactive ion etching (ICP-RIE) process for removing the second mask layer 33, the bottom portion 311 and 312 of the lateral strengthening structure 38, and part of the silicon substrate 31, as shown in FIG. 3(*e*). As such, the lower structure 65 is formed and the unstrengthened structure is exposed. According to one aspect of the present invention, there are three purposes in the third etching process. The first one is to remove the boron-doped silicon at the bottom portion of the peripheral wall, but leave the lateral strengthening structure 38 at the vertically peripheral wall; the second one is to form the depth of the sacrificial layer by the etching process; the third one is to selectively trim the thickness of the lower structure 65 and the elastic structure 66 so that the HARM having a height difference at the upper surface thereof is achieved.

Lastly, the unstrengthened structure is etched laterally through a silicon wet-etching process so that the upper structure 62 and the elastic structure 66 are released. Accordingly, the high-aspect-ratio-microstructure (HARM) is accomplished. The lower structure 65 of the HARM is a fixed lower electrode with a comb shape, while the upper structure 62 is a movable upper electrode with a comb shape.

Figure 4:
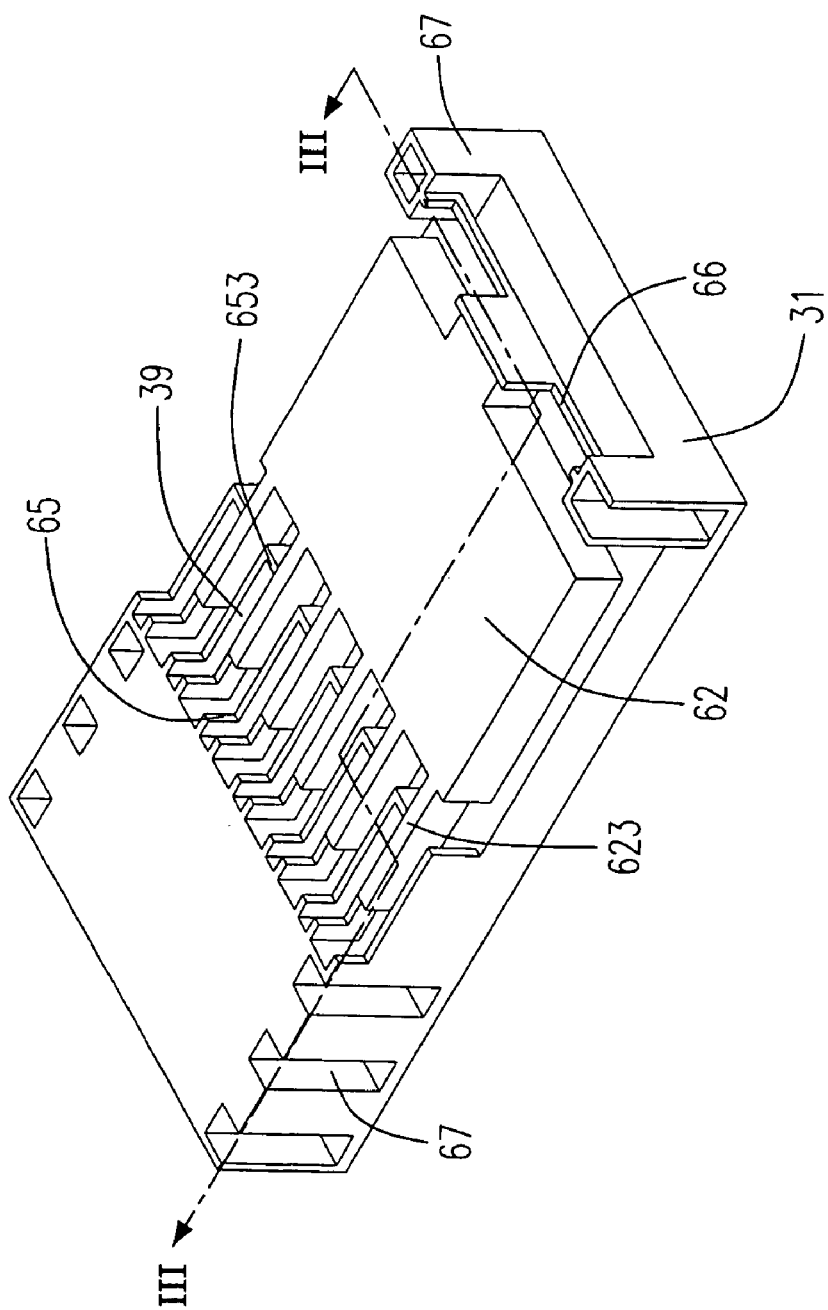
FIG. 4 is a diagram showing the high-aspect-ratio-microstructure (HARM) according to a preferred embodiment of the present invention.

According to one preferred embodiment of the present invention, the high-aspect-ratio-microstructure (HARM) is disclosed. Please refer to FIG. 3(*f*) and FIG. 4. FIG. 3(*f*) shows the sectional view of the accomplished HARM, while FIG. 4 shows 3-D structure of the high-aspect-ratio-microstructure (HARM). The high-aspect-ratio-microstructure (HARM) includes the silicon substrate 31, the post structure 67, the elastic structure 66, the lower structure 65, the upper structure 62, and the lateral strengthening structure 38. The post structure 67 is formed on the silicon substrate 31 and extended upwards thereon. Further, the post structure 67 is vertically connected to elastic structure 66. The lower structure 65 is fixedly mounted on the silicon substrate 31 and is a comb shape having first plural comb fingers 653. In addition, each of the first plural comb fingers 653 has a thin slot 39 thereon. The upper structure 62 is a comb shape having second plural comb fingers 623. The first plural comb fingers 653 and the second plural comb fingers 623 are respectively extended into the spaces therebetween. The lower structure 65 and the upper structure 62 have a height difference therebetween so as to form an uneven surface of the HARM. In addition, the HARM further includes a lateral strengthening structure 38 which is formed at the vertically peripheral walls of the post structure 67, the first plural comb fingers 653 and the second plural comb fingers 623 in order to protect the post structure 67, the first plural comb fingers 653 and the second plural comb fingers 623. Further, the post structure 67 is vertically connected to the elastic structure 66 so that the post structure 67 and the elastic structure 66 constitute an elastic bridge. The upper structure 62 is connected to the elastic bridge through the elastic structure 66 so that the upper structure 62 can elastically move with the elastic bridge.

Figure 5:
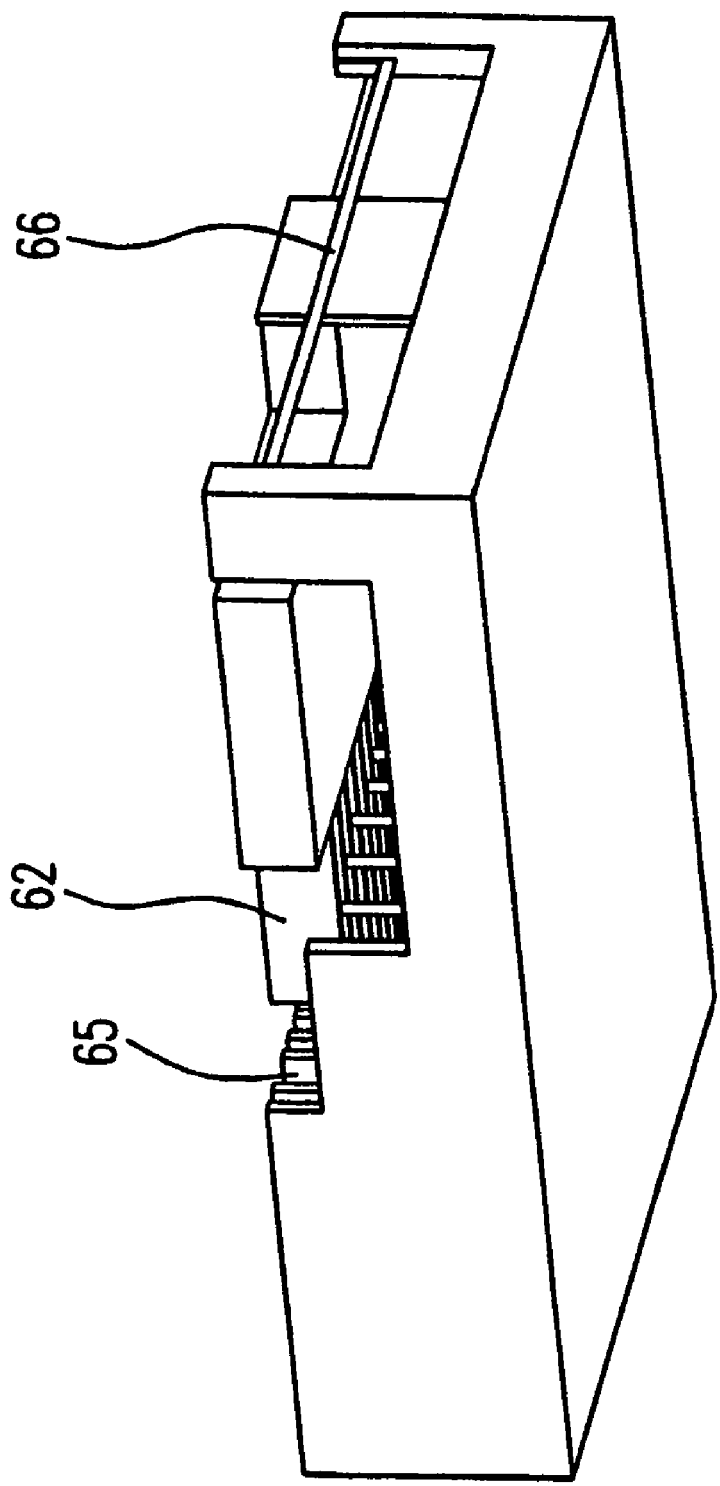
FIG. 5 is a side view of the high-aspect-ratio-microstructure (HARM) according to a preferred embodiment of the present invention.

According to a preferred embodiment of the present invention, the high-aspect-ratio-microstructure (HARM) can be implemented as a vertical comb actuator. Please refer to FIG. 4 and FIG. 5. FIG. 5 is a side view of the high-aspect-ratio-microstructure (HARM) according to a preferred embodiment of the present invention. The lower structure 65 is served as a fixed lower electrode 653 with a comb shape, while the upper structure 62 is served as a movable upper electrode 623 with a comb shape. The upper electrode 623 is connected to the elastic bridge which provides an elastic force to render the upper electrode 623 movable in a vertical and a horizontal directions. Accordingly, the actuation force is generated. Furthermore, the post structure 67 is a boron post. The first space 315 positioned under the post structure 67 is formed by etching the silicon substrate 31 and the second space 316 positioned under the thin slot 39 is formed by etching the silicon substrate 31. In other words, the depths of the post structure 67 and the thin slot 39 are extended into the silicon substrate 31. The lateral strengthening structure 38 is formed by performing a boron ion diffusion process that the wet-etching resisting material is formed at the vertically peripheral wall. The formed wet-etching resisting material is boron-doped silicon. According to another embodiment of the present invention, the lateral strengthening structure 38 can be formed by a silicon oxidization process as well and the generated wet-etching resisting material is silicon dioxide ($SiO_2$).

According to the vertical comb actuator manufactured from the high-aspect-ratio-microstructure (HARM) provided in the present invention, the main feature is that the fixed lower electrode 653 is located lower than the sacrificial layer because of the design of the post structure 67. As such, the movable upper electrode 623 has a wider space for downwards moving and the power of the unsymmetrical electric field is increased accordingly. Besides, by the manufacturing method for the high-aspect-ratio-microstructure (HARM) provided in the present invention, the HARM structure with different thicknesses can be formed on the same silicon machinery through controlling one of the mask layers or the etching steps in the process. Therefore, the requirement for making the thickness of the elastic structure smaller than the HARM structure thickness is achieved, which is a huge improvement in the HARM manufacturing process.

Hence, the selective etching method with lateral protection function and the manufactured structure thereof provided in the present invention have the advantages as follows: (1) Since the alignment accuracy between the upper and the lower electrodes seriously affects the actuation ability, the requirement for the alignment accuracy in the manufacturing process using separate masking steps for the electrodes is extremely high. However, according to the present invention, the upper and the lower electrodes are defined by the same masking step, such that the alignment problem does not exist. (2) In the conventional manufacturing process, the interval distance must be as lengthy as 2 times. However, there is no such limitation in the present invention. That is, the interval distance can be designed as short as possible so as to enhance the actuation force. (3) Since the upper and the lower electrodes with desired thickness can be achieved and the HARM structure thickness can be adjusted by controlling the etching depth, a stronger actuation force and a wider movement are obtainable. (4) The manufacturing process is not complicated that only three masking steps are needed and there is no step of chip connection. Therefore, it is a highly stable manufacturing process.

Figure 6:
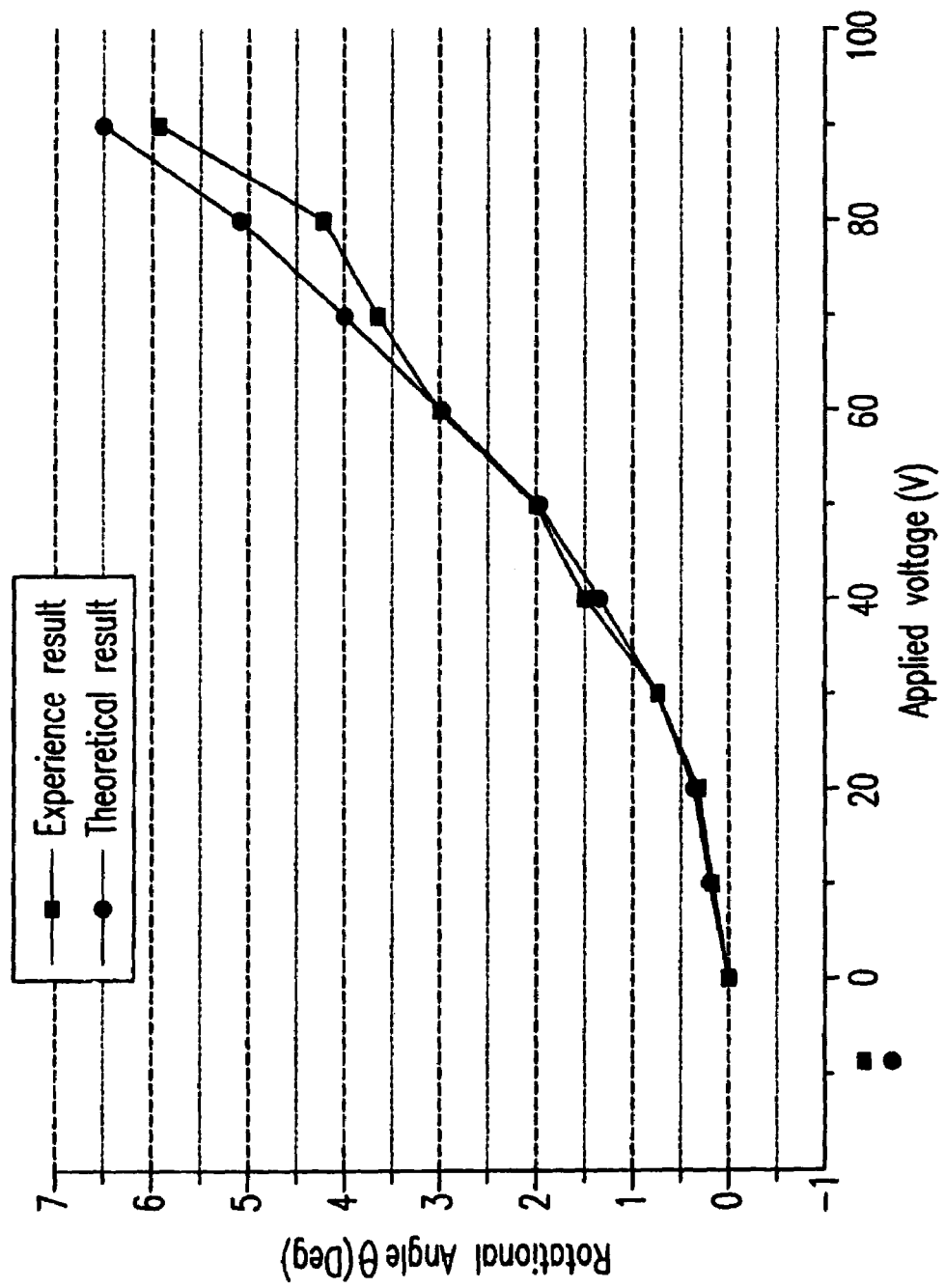
FIG. 6 is a diagram showing the change of the rotational angle driven by the applied voltage according to a preferred embodiment of the present invention.
Figure 7:
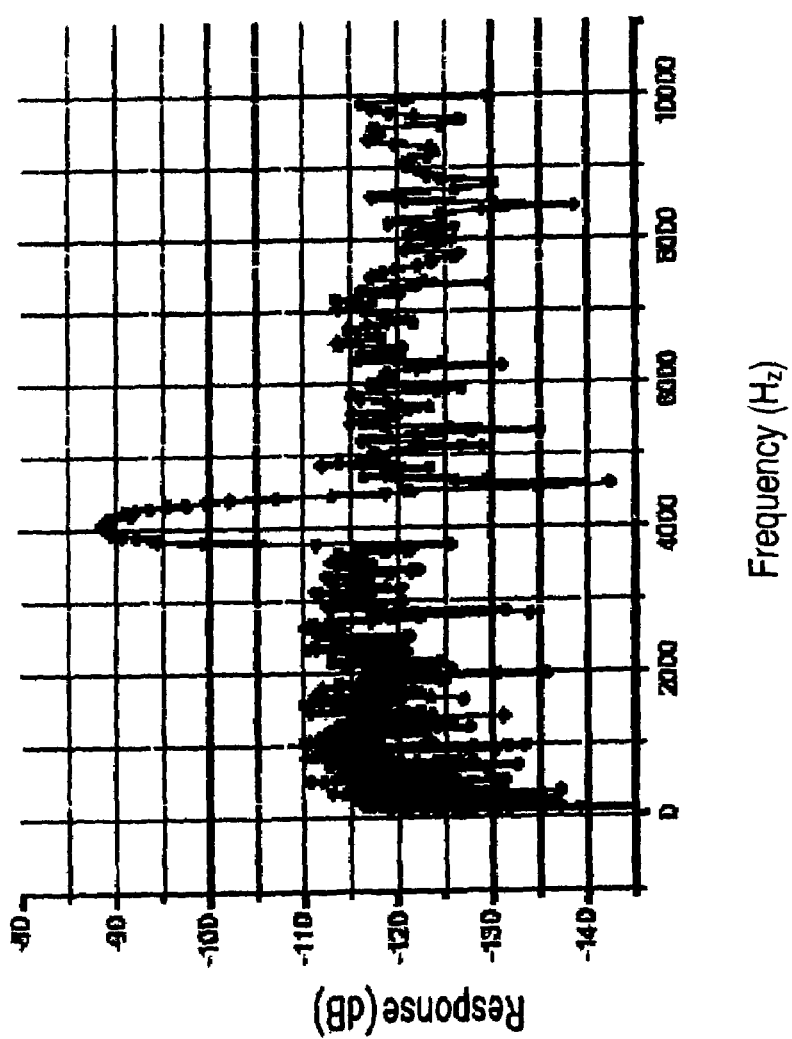
FIG. 7 is diagram showing the frequency response of the vertical comb actuator when driven by an alternating current according to a preferred embodiment of the present invention.

According to a preferred embodiment of the present invention, the vertical comb actuator manufactured from the high-aspect-ratio-microstructure (HARM) can be applied to the micro optical scanner. With regard to the operation of the vertical comb actuator, the actuation driven by the direct current is measured by an optical interferometer. Please refer to FIG. 6. FIG. 6 is a diagram showing the change of the rotational angle driven by the applied voltage. Both the theoretical result and the experience result for the load-deflection relation of the torsional micromirror are shown. The torsional micromirror has optical scanning angle near 5 degree when driven at 90 V. Further, the actuation driven by the alternating current is measured by an laser Doppler velocimetry (LDV). Please refer to FIG. 7. FIG. 7 is diagram showing the frequency response of the vertical comb actuator when driven by an alternating current. From FIG. 7, it is known the amplitude has a peak at 4.1 kHz that has a quality factor of 7 resulted from the resonance of the structure. Compared with the optical scanning angle of 5 degree obtained from being driven by the direct current, the resonance driving force has the advantages of smaller input energy and larger amplitude.

According to the above, the drawbacks in the conventional manufacturing method for the high-aspect-ratio-microstructure are overcome by the selective etching method with lateral protection function provided in the present invention. Basically, the deep etching technique and the mechanism for laterally releasing the structure of silicon ship are employed, plus the etching-terminated feature of the boron-doped silicon is applied, the thickness of the fixed lower electrode and the elastic structure is selectively timed through one deep etching step. As such, the rigidity of the elastic structure is reduced and the motion range of the vertical comb actuator is raised. Therefore, the requirement for applying the manufacturing method provided in the present invention to the mass production of optical components can be easily achieved. Hence, the present invention not only has a novelty and a progressive nature, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A high-aspect-ratio-microstructure (HARM), comprising:
    a substrate;
    a lower structure with a comb shape fixedly mounted on said substrate and having first plural comb fingers, wherein each of said first plural comb fingers has a thin slot thereon;
    an upper structure with a comb shape having second plural comb fingers, wherein said lower structure and said upper structure have a height difference therebetween so as to form an uneven surface; and
    a lateral strengthening structure formed at vertically peripheral walls of said first plural comb fingers and said second plural comb fingers for protecting said plural first and second comb fingers.

2. The high-aspect-ratio-microstructure according to claim 1, wherein said first plural comb fingers and said second plural comb fingers are respectively extended into spaces therebetween.

3. The high-aspect-ratio-microstructure according to claim 1 further comprising a post structure formed on said substrate and extended upwards thereon.

4. The high-aspect-ratio-microstructure according to claim 3, wherein said post structure is a boron post.

5. The high-aspect-ratio-microstructure according to claim 3, wherein said post structure comprises said lateral strengthening structure for protecting said post structure.

6. The high-aspect-ratio-microstructure according to claim 3, wherein a first space positioned under said post structure is formed by etching said substrate.

7. The high-aspect-ratio-microstructure according to claim 3, wherein said post structure is vertically connected to an elastic structure.

8. The high-aspect-ratio-microstructure according to claim 7, wherein said post structure and said elastic structure constitute an elastic bridge.

9. The high-aspect-ratio-microstructure according to claim 8, wherein said elastic bridge is connected to said upper structure for providing an elastic force to render said upper structure movable in a vertical and a horizontal directions.

10. The high-aspect-ratio-microstructure according to claim 1, wherein said substrate is a silicon substrate.

11. The high-aspect-ratio-microstructure according to claim 1, wherein said lower structure is a fixed lower electrode with a comb shape.

12. The high-aspect-ratio-microstructure according to claim 1, wherein a second space positioned under said thin slot is formed by etching said substrate.

13. The high-aspect-ratio-microstructure according to claim 1, wherein said upper structure is a movable upper electrode with a comb shape.

14. The high-aspect-ratio-microstructure according to claim 1, wherein said lateral strengthening structure has a wet-etching resisting material and is formed by a boron ion diffusion process.

15. The high-aspect-ratio-microstructure according to claim 14, wherein said wet-etching resisting material is a boron-doped silicon.

16. The high-aspect-ratio-microstructure according to claim 15, wherein said lateral strengthening structure made of a boron-doped silicon is a conductive layer.

17. The high-aspect-ratio-microstructure according to claim 1, wherein said lateral strengthening structure has a wet-etching resisting material and is formed by a silicon oxidization process.

18. The high-aspect-ratio-microstructure according to claim 17, wherein said wet-etching resisting material is a silicon dioxide ($SiO_2$).

19. A high-aspect-ratio-microstructure (HARM), comprising:
    a substrate;
    a post structure formed on said substrate and extended upwards;
    an elastic structure vertically connected to said post structure;
    a lower structure with a comb shape fixedly mounted on said substrate and having first plural comb fingers, wherein each of said first plural comb fingers has a thin slot thereon;
    an upper structure with a comb shape connected with said elastic structure for being movable by an elastic force thereof and having second plural comb fingers, wherein said plural first comb fingers and said plural second comb fingers are respectively extended into spaces therebetween, and wherein a height difference is formed between said lower structure and said upper structure so as to form an uneven surface; and
    a lateral strengthening structure formed at periphery-vertical walls of said first plural comb fingers and said second plural comb fingers for protecting said first and second plural comb fingers.

* * * * *